United States Patent [19]

Okada et al.

[11] Patent Number: 5,244,828

[45] Date of Patent: Sep. 14, 1993

[54] METHOD OF FABRICATING A QUANTUM DEVICE

[75] Inventors: Kenji Okada, Suita; Yasuaki Terui, Neyagawa; Juro Yasui, Toyonaka; Yoshihiko Hirai, Osaka; Masaaki Niwa, Hirakata; Atsuo Wada, Suita; Kiyoshi Morimoto, Neyagawa, all of Japan

[73] Assignee: Matsushita Electric Industrial Co., Ltd., Osaka, Japan

[21] Appl. No.: 934,953

[22] Filed: Aug. 25, 1992

[30] Foreign Application Priority Data

Aug. 27, 1991 [JP] Japan .................................. 3-215204

[51] Int. Cl.⁵ .......................................... H01L 21/20
[52] U.S. Cl. ..................................... 437/81; 437/107; 437/133; 257/9
[58] Field of Search ........................ 437/81, 107, 133; 257/9

[56] References Cited

U.S. PATENT DOCUMENTS 4,865,923  9/1989  Ralston et al. ................... 437/133
5,106,764  4/1992  Harriott et al. .................... 437/81

Primary Examiner—Olik Chaudhuri
Assistant Examiner—Ramamohan Rao Paladugu
Attorney, Agent, or Firm—Renner, Otto, Boisselle & Sklar

[57] ABSTRACT

The method of fabricating a quantum device of the invention includes the steps of: forming a quantum dot having side faces on a first insulating layer; forming a second insulating layer which can function as a tunnel film, on at least the side faces of the quantum dot; depositing a non-crystal semiconductor layer on the first insulating layer so as to cover the quantum dot; removing at least a portion of the non-crystal semiconductor layer which is positioned above the quantum dot; single-crystallizing a predetermined portion of the non-crystal semiconductor layer which is in contact with the second insulating layer; and forming a quantum wire which includes the single-crystallized semiconductor portion and the quantum dot, on the first insulating layer.

20 Claims, 2 Drawing Sheets

METHOD OF FABRICATING A QUANTUM DEVICE

BACKGROUND OF THE INVENTION

1. Field of the Invention:

The present invention relates to a method of fabricating a quantum device.

2. Description of the Prior Art:

As semiconductor devices have been researched and developed, the semiconductor devices are miniaturized and hence semiconductor integrated circuits with a high degree of integration are realized. Also, fine pattern formation techniques such as lithography and etching techniques for fabricating such semiconductor devices have been developed. However, a conventional semiconductor device such as a transistor is not suitable to having a more finely integrated structure. Therefore, in order to obtain further miniaturized electronic devices and more highly integrated circuits, it is required to develop a novel device which has a structure different from that of the conventional semiconductor device.

A device which utilizes a quantum effect (hereinafter, referred to as "a quantum device") is expected and investigated as the novel device. In order to achieve the quantum effect, it is necessary for the quantum device to include a portion having a size substantially as large as that of the wavelength of an electron. As the portion having a size substantially as large as that of the wavelength of an electron, "a quantum dot" or "a quantum wire" is formed. In practice, in order to use the quantum device, it is required to form fine "quantum dots" and "quantum wires" with good uniformity and controllability.

SUMMARY OF THE INVENTION

The method of fabricating a quantum device of this invention comprises steps of: forming a quantum dot having side faces on a first insulating layer; forming a second insulating layer which can function as a tunnel film, on at least the side faces of the quantum dot; depositing a non-crystal semiconductor layer on the first insulating layer so as to cover the quantum dot; removing at least a portion of the non-crystal semiconductor layer which is positioned above the quantum dot; single-crystallizing a predetermined portion of the non-crystal semiconductor layer which is in contact with the second insulating layer; and forming a quantum wire which includes the single-crystallized semiconductor portion and the quantum dot, on the first insulating layer.

Alternatively, a method of fabricating a quantum device of the invention comprises the steps of: forming a quantum dot having side faces on a first insulating layer; forming a second insulating layer which can function as a tunnel film, on at least the side faces of the quantum dot; depositing a non-crystal semiconductor layer on the first insulating layer so as to cover the quantum dot; removing at least a portion of the non-crystal semiconductor layer which is positioned above the quantum dot; forming a quantum wire including a predetermined portion of the non-crystal semiconductor layer which is in contact with the second insulating layer and the quantum dot, on the first insulating layer; and single-crystallizing a non-crystal portion of the quantum wire.

Alternatively, a method of fabricating a quantum device of the invention comprises the steps of: forming a first quantum wire having side faces on a first insulating layer; forming a second insulating layer which can function as a tunnel film, on at least the side faces of the first quantum wire; depositing a non-crystal semiconductor layer on the first insulating layer so as to cover the first quantum wire; removing at least a portion of the non-crystal semiconductor layer which is positioned above the first quantum wire; single-crystallizing a predetermined portion of the non-crystal semiconductor layer which is in contact with the second insulating layer; and forming a second quantum wire which includes the single-crystallized semiconductor portion and part of the first quantum wire, on the first insulating layer.

Alternatively, a method of fabricating a quantum device of the invention comprises the steps of: forming a first quantum wire having side faces on a first insulating layer; forming a second insulating layer which can function as a tunnel film, on at least the side faces of the first quantum wire; depositing a non-crystal semiconductor layer on the first insulating layer so as to cover the first quantum wire; removing at least a portion of the non-crystal semiconductor layer which is positioned above the first quantum wire; forming a second quantum wire including a predetermined portion of the non-crystal semiconductor layer which is in contact with the second insulating layer and part of the first quantum wire, on the first insulating layer; and single-crystallizing a non-crystal portion of the second quantum wire.

Thus, the invention described herein makes possible the advantages of (1) providing a method of fabricating a quantum device in which the number of crystal defects in a quantum wire is reduced, and (2) providing a method of fabricating a quantum device in which the possibility of electron scattering in a quantum wire is reduced.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

A method of fabricating a quantum device according to the invention will be described with reference to FIGS. 1A to 1H.

First, a silicon oxide film (a first insulating layer) 2 is formed on one main surface of a silicon substrate 1. For the silicon substrate 1, a usual single-crystal substrate which is used when fabricating a conventional semiconductor device is suitable. The silicon oxide film 2 is formed, for example, by thermally oxidizing the surface of the silicon substrate 1. Alternatively, the silicon oxide film 2 may be deposited on the silicon substrate 1 by chemical vapor deposition (CVD). Thereafter, a single-crystal silicon layer 3 is formed on the silicon oxide film 2 using a silicon-on-insulator (SOI) technique. The single-crystal silicon layer 3 has a thickness of about 50 nm. Preferably, the thickness thereof is from 10 nm to 30 nm. As described above, the single-crystal silicon layer 3 is preferably formed on an insulator (the silicon oxide film 2). As the insulator for supporting the single-crystal silicon layer 3, in place of the single-crystal silicon substrate 1 the main surface of which is covered with the silicon oxide film 2, an insulating substrate such as a glass substrate or a sapphire substrate can be used.

Figure 1A:
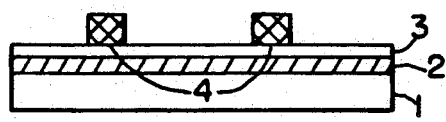
FIGS. 1A to 1H are views showing respective steps of a method of fabricating a quantum device according to the invention.
Figure 1B:
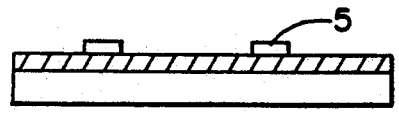

Next, as shown in FIG. 1A, a resist layer 4 having a quantum dot pattern is formed on the single-crystal silicon layer 3 by a lithography technique. The exposed portions where the single-crystal silicon layer 3 is not covered with the resist layer 4 are etched using the resist layer 4 as a mask. After the etching, the resist layer 4 is removed. Thus, as shown in FIG. 1B, a quantum dot 5 made of single crystal silicon is formed on the silicon oxide film 2. The quantum dot 5 typically has three dimensions of 50 nm (thickness)×30 nm (width)×30 nm (length). However, so far as the quantum effect is achieved, the dimensions of the quantum dot 5 are not limited to the above values. Each of the dimensions is preferably about 10 nm or smaller.

Figure 1C:
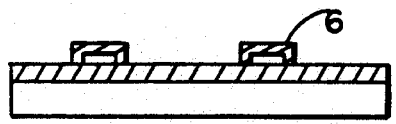

As shown in FIG. 1C, by thermally oxidizing the exposed surface of the quantum dot 5 (i.e., the top face and the side faces of the quantum dot 5), an oxide film (a second insulating film) 6 is formed on the quantum dot 5. The oxide film 6 is about from 1 nm to 5 nm in thickness. The oxide film 6 later functions as a tunnel oxide film. Therefore, the thickness of the oxide film 6 is preferably about 3 nm or smaller. The oxide film 6 is an insulating film of good quality which is formed by thermally oxidizing the surface of the quantum dot 5 of single crystal silicon. For example, instead of the oxide film 6, a thin insulating film can be deposited on the surface of the quantum dot 5 by CVD. However, such an insulating film is slightly inferior in performance as a tunnel oxide film to the oxide film 6. In this example, the oxide film 6 covers the top face and the side faces of the quantum dot 5, but it is sufficient for the oxide film 6 to cover at least the side faces (i.e., faces which will be in contact with a quantum wire) of the quantum dot 5.

Figure 1D:
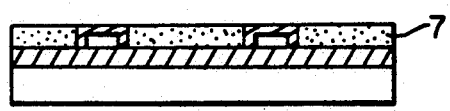
Figure 1E:
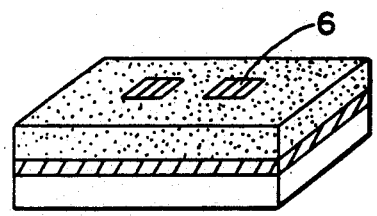

Then, a polycrystalline silicon film 7 is deposited on the silicon oxide film 2 so as to cover the quantum dot 5 (and the oxide film 6). The polycrystalline silicon film 7 is preferably deposited by low pressure CVD. Preferably, the thickness of the polycrystalline silicon film 7 is about from 50 nm to 100 nm. The top face of the polycrystalline silicon film 7 has raised portions in accordance with the existence of the quantum dots 5 (and the oxide films 6) under the polycrystalline silicon film 7. By using a etch back process which is used in a semiconductor integrated circuit fabricating technique, the raised portion of the polycrystalline silicon film 7 is etched. Thus, the top face of the polycrystalline silicon film 7 is substantially planarized, as shown in FIG. 1D. As shown in FIG. 1E, by this etch back process, the top face of the oxide film 6 which covers the quantum dot 5 is exposed. The main purpose of this etch back process is to remove the polycrystalline silicon film 7 which exits above the quantum dot 5. Therefore, after this etch back process, the top face of the remaining polycrystalline silicon film 7 is not necessarily planarized. In order to remove the polycrystalline silicon film which exists above the quantum dot 5, the portion to be removed may be selectively etched. By the selective etching, the top face of the remaining polycrystalline silicon film 7 is not sufficiently planarized.

Figure 1F:
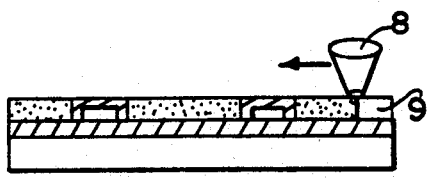
Figure 1G:
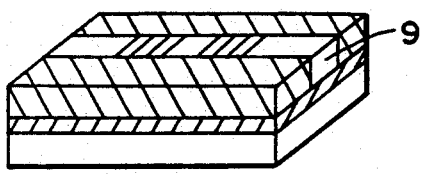

Next, as shown in FIG. 1F, part of the polycrystalline silicon film 7 is irradiated by a laser beam 8. The laser beam 8 scans a selected region of the polycrystalline silicon film 7. The temperature of the irradiated region of the polycrystalline silicon film 7 by the laser beam 8 rises to or over the melting point of polycrystalline silicon and the irradiated region is melted. The melted region is made into single crystal by recrystallization after the melt. The laser beam 8 scans the polycrystalline silicon film 7 across the quantum dot 5, so that a single-crystal layer 9 having a shape of a wire is obtained, as shown in FIG. 1G.

Figure 1H:
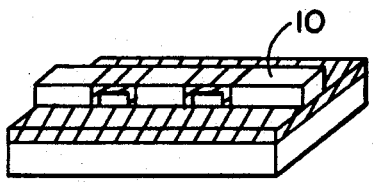

By selectively removing the polycrystalline silicon film 7, a quantum wire 10 for connecting the quantum dots 5 to each other is obtained, as shown in FIG. 1H. The width of the quantum wire 10 is about 50 nm. The width thereof depends on the beam diameter of the laser beam 8. The diameter of the laser beam 8 used in this example is about 50 nm. The diameter thereof is preferably in the range of about 10 nm to 30 nm.

In this example, the polycrystalline silicon film 7 is deposited by CVD. Therefore, a smooth interface between the oxide film 6 and the polycrystalline silicon film 7 is obtained, and the polycrystalline silicon film 7 has a reduced number of crystal defects. The single-crystal silicon film 9 which is obtained by recrystallizing the polycrystalline silicon film 7 of good quality has a further reduced number of crystal defects. In the quantum wire 10 formed by the fabricating method of the invention, the number of crystal defects is reduced and hence the possibility of electron scattering is lowered.

According to the method of the invention, when the polycrystalline silicon film 7 is formed on the oxide film 6, the oxide film 6 is not reduced. Therefore, the thickness of the oxide film 6 is not varied from the desired one, and the disadvantage in that the oxide film 6 is different in thickness for every quantum dot 5 is avoided. In the quantum device, the variation in size causes the energy band structure of the electrons to be changed. The change in energy band structure causes the operating characteristics of the quantum device to be changed. According to the fabricating method of the invention, the precision in size is improved, so that quantum devices having uniform operating characteristics are provided.

In this example, in order to form the single-crystal silicon film 9 from the polycrystalline silicon film 7, the laser beam irradiation (laser annealing) method is used. Another method such as an electron beam irradiation (electron beam annealing) method or a focused ion beam (FIB) method may be used, so far as the polycrystalline silicon film 7 can be melted and recrystallized by the irradiation of an energy beam.

In this example, the patterning step is performed after the recrystallization step by the laser beam 8 shown in FIG. 1F, so that the quantum wire 10 is formed as shown in FIG. 1H. Alternatively, the polycrystalline silicon film 7 is first patterned into a shape of a quantum wire, and then the polycrystalline silicon film 7 is irradiated by a laser beam to be made into a single-crystal film.

Figure 3:
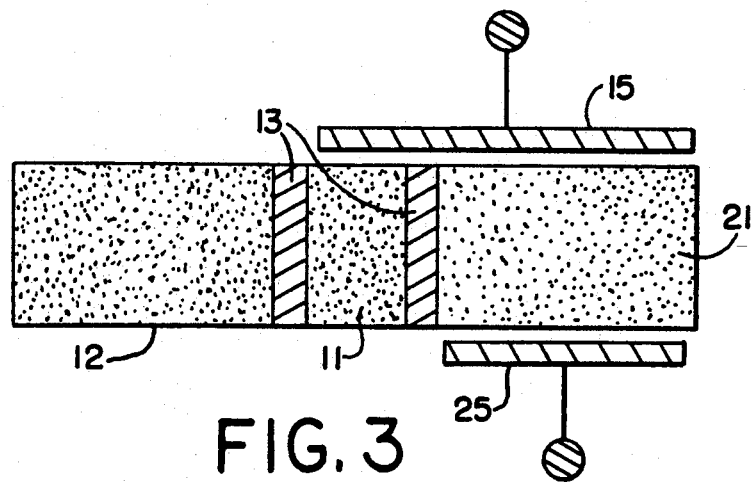
FIG. 3 is a view for illustrating an exemplary operation of a quantum device.

The operation of the quantum device thus obtained will be described below with reference to FIG. 3. The quantum device shown in FIG. 3 includes a writing portion 12 which functions as interconnection in a quantum wire, a first quantum dot 11, a second quantum dot 21, an insulating film 13 which functions as a potential barrier, and a pair of electrodes 15 and 25. The first electrode 15 is in contact with the first and second quantum dots 11 and 21 via an insulating film (not shown). The second electrode 25 is in contact with the second quantum dot 21 via an insulating film (not shown). The electrodes 15 and 25 are added to the structure formed in accordance with the method of the invention, using a known process.

By adjusting the potentials applied to the first electrode 15 and the second electrode 25 of the quantum device, a quantum level A of the first quantum dot 11 coincides with a quantum level B of the second quantum dot 21, and the quantum levels A and B are equal to or lower than the Fermi level of the writing portion 12 of the quantum wire. As a result, in the wiring portion 12, electrons with the same energy level as the quantum levels A and B are transmitted through the potential barrier (the insulating film 13) and moved to the first quantum dot 11. The electrons which have been moved from the wiring portion 12 to the first quantum dot 11 occupy the quantum level A of the first quantum dot 11. These electrons are further moved to the second quantum dot 21 due to a resonance tunneling effect, and occupy the quantum level B of the second quantum dot 21. Among the quantum levels lower than the quantum level B of the second quantum dot 21, if there exists a quantum level which is not occupied by electrons, the electrons which occupy the quantum level B of the second quantum dot 21 are then transferred to the lower quantum level. Such an operation corresponds to a write operation of a memory device.

By adjusting the potentials applied to the first electrode 15 and the second electrode 25, the quantum level A of the first quantum dot 11 coincides with the quantum level B of the second quantum dot 21, and the quantum levels A and B are equal to or higher than the fermi level of the wiring portion 12. As a result, electrons which occupy the quantum level B of the second quantum dot 21 are transmitted through the potential barrier 13 and moved to the first quantum dot 11 due to the resonance tunneling effect. The electrons which have been moved from the second quantum dot 21 to the first quantum dot 11 occupy the quantum level A of the first quantum dot 11. These electrons are further moved to the wiring portion 12 due to the resonance tunneling effect, and occupy a quantum level C of the wiring portion 12. Among the quantum levels lower than the quantum level C of the wiring portion 12, if there exists a quantum level which is not occupied by electrons, the electrons which occupy the quantum level C of the wiring portion 12 are then transferred to the lower quantum level.

As described above, in the quantum device shown in FIG. 3, electrons can be moved from the wiring portion 12 to the second quantum dot 21 and held in the second quantum dot 21 by utilizing the quantum effect. Furthermore, the electrons can be read out from the second quantum dot 21 to the wiring portion 12. Based on the above-described operation principle, the quantum device can be used as a memory device. The quantum device manufactured by the method of the present invention is not limited to a memory device which operates as described above. The invention is applicable to the fabrication of a quantum device which operates in a different manner.

EXAMPLE 2

Another method of fabricating a quantum device according to the invention will be described with reference to FIGS. 2A to 2F.

Figure 2A:
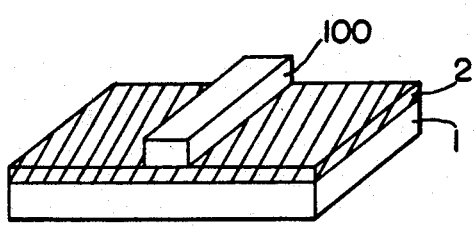
FIGS. 2A to 2F are views showing respective steps of another method of fabricating a quantum device according to the invention.

First, a silicon oxide film 2 is formed on one main surface of a silicon substrate 1. The silicon oxide film 2 is formed, for example, by thermally oxidizing the surface of the silicon substrate 1. Alternatively, the silicon oxide film 2 may be deposited on the silicon substrate 1 by CVD. Thereafter, a quantum wire 100 of single crystal silicon is formed on the silicon oxide film 2 using the SOI technique, as shown in FIG. 2A. The quantum wire 100 has the dimensions of 50 nm (thickness $\times$ 50 nm (width). Each of the dimensions of the quantum wire 100 is not limited to the above value. Preferably, each dimension is approximately equal to or smaller than 30 nm.

Figure 2B:
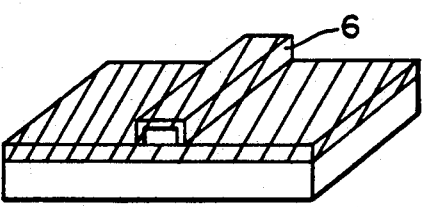

As shown in FIG. 2B, an oxide film 6 is formed on the quantum wire 100 by oxidizing the exposed surface (the top face and the side faces) of the quantum wire 100. The oxide film 6 is about from 1 nm to 5 nm in thickness. The oxide film 6 later functions as a tunnel oxide film. Therefore, the thickness of the oxide film 6 is preferably about 3 nm or smaller. The oxide film 6 is an insulating film of good quality which is formed by thermally oxidizing the surface of the quantum wire 100 of single crystal silicon. For example, instead of the oxide film 6, a thin insulating film can be deposited on the surface of the quantum wire 100 by CVD.

Figure 2C:
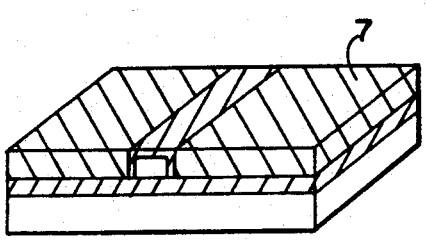

Then, a polycrystalline silicon film 7 is deposited on the silicon oxide film 2 so as to cover the quantum wire 100 (and the oxide film 6). The polycrystalline silicon film 7 is preferably deposited by low pressure CVD. Preferably, the polycrystalline silicon film 7 is about from 50 nm to 100 nm in thickness. The top face of the polycrystalline silicon film 7 has raised portions in accordance with the existence of the quantum wire 100 (and the oxide film 6) under the polycrystalline silicon film 7. By using an etch back process which is used in a semiconductor integrated circuit fabricating technique, the raised portion of the polycrystalline silicon film 7 is etched. Thus, the top face of the polycrystalline silicon film 7 is substantially planarized, as shown in FIG. 2C. As shown in FIG. 2C, by this etch back process, the top face of the oxide film 6 which covers the quantum wire 100 is exposed.

Figure 2D:
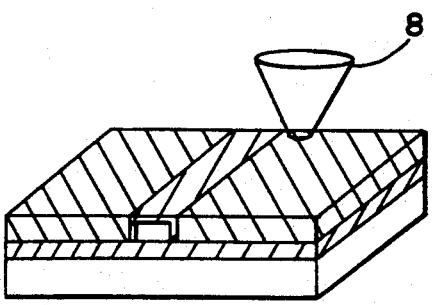
Figure 2E:
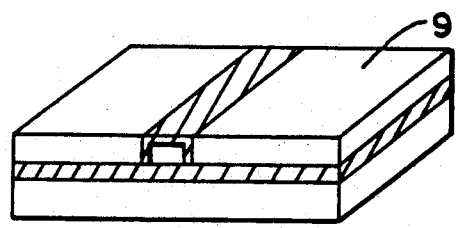

Next, as shown in FIG. 2D, the polycrystalline silicon film 7 is irradiated by a laser beam 8. The laser beam 8 scans the polycrystalline silicon film 7. The temperature of the irradiated region of the polycrystalline silicon film 7 by the laser beam 8 rises to or over the melting point of polycrystalline silicon and hence the irradiated region is melted. The melted region is made into single crystal by recrystallization after the melt. The laser beam 8 scans a comparatively large area of the polycrystalline silicon film 7 including the portion of the quantum wire 100, so that a single-crystal silicon layer 9 which sandwiches the quantum wire 10 is obtained, as shown in FIG. 2E.

Figure 2F:
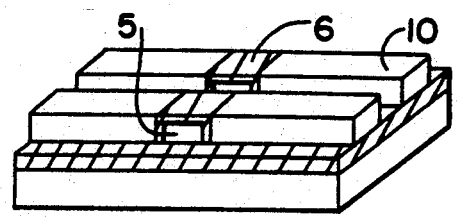

By patterning the single-crystal silicon film 9 and the quantum wire 100 by using the lithography and etching techniques, a quantum dot 5 and a quantum wire 10 which is connected to a quantum dot 5 are obtained, as shown in FIG. 2F. The quantum wire 10 has a width of about 50 nm.

In this example, the polycrystalline silicon film 7 is deposited by low pressure CVD. Therefore, a smooth interface between the oxide film 6 and the polycrystalline silicon film 7 is obtained, and the polycrystalline silicon film 7 has a reduced number of crystal defects. The single-crystal silicon film 9 which is obtained by recrystallizing the polycrystalline silicon film 7 of good quality also has a reduced number of crystal defects. In the quantum wire 10 formed by the fabricating method of the invention, the number of crystal defects is reduced and hence the possibility of electron scattering is lowered.

According to the method of the invention, when the polycrystalline silicon film 7 is deposited on the oxide film 6, the oxide film 6 is not reduced. Therefore, the thickness of the oxide film 6 is not varied, and the disadvantage in that the oxide film 6 is different in thickness for every quantum dot 5 is avoided. In the quantum device, the variation in size causes the energy band structure of electron to be changed. The change in energy band structure causes the operating characteristics of the quantum device to be changed. According to the fabricating method of the invention, the precision in size is improved, so that quantum devices having uniform operating characteristics are provided.

In this example, in order to form the single-crystal silicon film 9 from the polycrystalline silicon film 7, the laser beam irradiation (laser annealing) method is used. Another method such as an electron beam irradiation (electron beam annealing) method or a focused ion beam (FIB) method may be used.

In this example, the patterning step is performed after the recrystallization step by the laser beam 8 shown in FIG. 2D, so that the quantum wire 10 is formed as shown in FIG. 2F. Alternatively, the polycrystalline silicon film 7 is first patterned into the shape of a quantum wire, and then the polycrystalline silicon film 7 is irradiated by a laser beam to be made into a single-crystal film.

Moreover, in the above-mentioned first and second example, the quantum wire and the quantum dot are made of silicon, but may be made of another semi-conductor material or a conductive material. The oxide film is not limited to the silicon oxide film, but may be an oxide film of another material.

In the above-mentioned examples, a polycrystalline film is used, but another type of non-crystal film may be used. The non-crystal film herein means a film except for a single crystal film, such as an amorphous film and a polycrystalline film.

Various other modifications will be apparent to and can be readily made by those skilled in the art without departing from the scope and spirit of this invention. Accordingly, it is not intended that the scope of the claims appended thereto be limited to the description as set forth herein, but rather that the claims be broadly construed.

What is claimed is:

1. A method of fabricating a quantum device, the method comprising the steps of:
   forming a quantum dot having side faces on a first insulating layer;
   forming a second insulating layer which can function as a tunnel film, on at least the side faces of the quantum dot;
   depositing a non-crystal semiconductor layer on the first insulating layer so as to cover the quantum dot;
   removing at least a portion of the non-crystal semiconductor layer which is positioned above the quantum dot;
   single-crystallizing a predetermined portion of the non-crystal semiconductor layer which is in contact with the second insulating layer; and
   forming a quantum wire which includes the single-crystallized semiconductor portion and the quantum dot, on the first insulating layer.

2. A method of fabricating a quantum device according to claim 1, wherein the step of removing at least the portion positioned above the quantum dot is a step of substantially planarizing the non-crystal semiconductor layer.

3. A method of fabricating a quantum device according to claim 1, wherein the single-crystallization of the predetermined portion which is in contact with the second insulating layer is performed by melting and recrystallization by using an irradiation of an energy beam.

4. A method of fabricating a quantum device according to claim 1, wherein the step of forming the second insulating layer is a step of forming an insulating layer made of an oxide film by oxidizing a surface of the quantum dot.

5. A method of fabricating a quantum device according to claim 1, further comprising a step of forming the first insulating film on a semiconductor substrate, prior to the step of forming the quantum dot.

6. A method of fabricating a quantum device, the method comprising the steps of:
   forming a quantum dot having side faces on a first insulating layer;
   forming a second insulating layer which can function as a tunnel film, on at least the side faces of the quantum dot;
   depositing a non-crystal semiconductor layer on the first insulating layer so as to cover the quantum dot;
   removing at least a portion of the non-crystal semiconductor layer which is positioned above the quantum dot;
   forming a quantum wire including a predetermined portion of the non-crystal semiconductor layer which is in contact with the second insulating layer and the quantum dot, on the first insulating layer; and
   single-crystallizing a non-crystal portion of the quantum wire.

7. A method of fabricating a quantum device according to claim 6, wherein the step of removing at least the portion positioned above the quantum dot is a step of substantially planarizing the non-crystal semiconductor layer.

8. A method of fabricating a quantum device according to claim 6, wherein the single-crystallization of the non-crystal portion of the quantum wire is performed by melting and recrystallization by using an irradiation of an energy beam.

9. A method of fabricating a quantum device according to claim 6, wherein the step of forming the step insulating layer is a step of forming an insulating layer made of an oxide film by oxidizing a surface of the quantum dot.

10. A method of fabricating a quantum device according to claim 6, further comprising a step of forming the first insulating film on a semiconductor substrate, prior to the step of forming the quantum dot.

11. A method of fabricating a quantum device, the method comprising the steps of:

forming a first quantum wire having side faces on a first insulating layer;

forming a second insulating layer which can function as a tunnel film, on at least the side faces of the first quantum wire;

depositing a non-crystal semiconductor layer on the first insulating layer so as to cover the first quantum wire;

removing at least a portion of the non-crystal semiconductor layer which is positioned above the first quantum wire;

single-crystallizing a predetermined portion of the non-crystal semiconductor layer which is in contact with the second insulating layer; and forming a second quantum wire which includes the single-crystallized semiconductor portion and part of the first quantum wire, on the first insulating layer.

12. A method of fabricating a quantum device according to claim 11, wherein the step of removing at least the portion positioned above the first quantum wire is a step of substantially planarizing the non-crystal semiconductor layer.

13. A method of fabricating a quantum device according to claim 11, wherein the single-crystallization of the predetermined portion which is in contact with the second insulating layer is performed by melting and recrystallization by using an irradiation of an energy beam.

14. A method of fabricating a quantum device according to claim 11, wherein the step of forming the second insulating layer is a step of forming an insulating layer made of an oxide film by oxidizing a surface of the first quantum wire.

15. A method of fabricating a quantum device according to claim 11, further comprising a step of forming the first insulating film on a semiconductor substrate, prior to the step of forming the first quantum wire.

16. A method of fabricating a quantum device, the method comprising the steps of:

forming a first quantum wire having side faces on a first insulating layer;

forming a second insulating layer which can function as a tunnel film, on at least the side faces of the first quantum wire;

depositing a non-crystal semiconductor layer on the first insulating layer so as to cover the first quantum wire;

removing at least a portion of the non-crystal semiconductor layer which is positioned above the first quantum wire;

forming a second quantum wire including a predetermined portion of the non-crystal semiconductor layer which is in contact with the second insulating layer and part of the first quantum wire, on the first insulating layer; and single-crystallizing a non-crystal portion of the second quantum wire.

17. A method of fabricating a quantum device according to claim 16, wherein the step of removing at least the portion positioned above the first quantum wire is a step of substantially planarizing the non-crystal semiconductor layer.

18. A method of fabricating a quantum device according to claim 16, wherein the single-crystallization of the non-crystal portion of the second quantum wire is performed by melting and recrystallization by using an irradiation of an energy beam.

19. A method of fabricating a quantum device according to claim 16, wherein the step of forming the second insulating layer is a step of forming an insulating layer made of an oxide film by oxidizing a surface of the first quantum wire.

20. A method of fabricating a quantum device according to claim 16, further comprising a step of forming the first insulating film on a semiconductor substrate, prior to the step of forming the first quantum wire.

* * * * *